(12) United States Patent
Cardozo et al.

(10) Patent No.: US 12,037,684 B2
(45) Date of Patent: Jul. 16, 2024

(54) SOLIDS VAPORIZER

(71) Applicant: ENTEGRIS, INC., Billerica, MA (US)

(72) Inventors: Benjamin Cardozo, Burnet, TX (US); Jacob Thomas, Leander, TX (US)

(73) Assignee: ENTEGRIS, INC., Billerica, MA (US)

( * ) Notice: Subject to any disclaimer, the term of this patent is extended or adjusted under 35 U.S.C. 154(b) by 6 days.

(21) Appl. No.: 17/681,186

(22) Filed: Feb. 25, 2022

(65) Prior Publication Data

US 2022/0275506 A1 Sep. 1, 2022

Related U.S. Application Data

(60) Provisional application No. 63/154,414, filed on Feb. 26, 2021.

(51) Int. Cl.
*C23C 16/448* (2006.01)
*C23C 16/455* (2006.01)
*C23C 16/50* (2006.01)

(52) U.S. Cl.
CPC ........ *C23C 16/4481* (2013.01); *C23C 16/448* (2013.01); *C23C 16/45544* (2013.01); *C23C 16/45553* (2013.01); *C23C 16/50* (2013.01)

(58) Field of Classification Search
CPC .............. C23C 16/4481; C23C 16/448; C23C 16/45544; C23C 16/45553; C23C 16/50
See application file for complete search history.

(56) References Cited

U.S. PATENT DOCUMENTS

| 7,547,363 | B2 * | 6/2009 | Tomiyasu | C23C 16/4481 |
| | | | | 118/726 |
| 2003/0053799 | A1 * | 3/2003 | Lei | C23C 16/4481 |
| | | | | 118/722 |
| 2005/0039794 | A1 | 2/2005 | Birtcher | |
| 2007/0020394 | A1 | 1/2007 | Carpenter | |
| 2009/0283041 | A1 | 11/2009 | Tomiyasu | |
| 2018/0094351 | A1 * | 4/2018 | Verghese | C23C 16/4481 |
| 2020/0056283 | A1 | 2/2020 | Shero | |
| 2022/0195595 | A1 * | 6/2022 | Zhu | C23C 16/448 |
| 2022/0275506 | A1 * | 9/2022 | Cardozo | C23C 16/50 |

FOREIGN PATENT DOCUMENTS

| CN | 101245445 B | * | 7/2012 | ......... C23C 16/4481 |
| JP | 2015519478 A | * | 7/2015 | |
| JP | 7402985 B2 | * | 12/2023 | ............. B01B 1/005 |
| KR | 102027179 B1 | | 10/2019 | |
| WO | WO-2013181521 A2 | * | 12/2013 | ............. B01B 1/005 |
| WO | WO-2020026823 A1 | * | 2/2020 | ............. B05B 17/04 |

* cited by examiner

*Primary Examiner* — Jeffrie R Lund

(57) ABSTRACT

Vaporizer vessels include one or more reagent support panels, serving as dividers of interior space of the vessel, in a vertical orientation such as when filling the vaporizer vessels, and when rotated into a horizontal orientation, the panels support the vaporizable solid materials placed in one or more chambers formed by the panels and interior walls of the vessels and enable transfer of heat to those solid materials. The chambers are such that any or all chambers filled with the vaporizable solid materials provide a void space to allow the solid materials to vaporize and for gas to move through the vaporizer vessels when heated, to allow effective vaporization of the solid materials and further allow the vapor resulting from the solid materials to move to an outlet of the vessels where it can be provided as part of a process.

12 Claims, 7 Drawing Sheets

SOLIDS VAPORIZER

FIELD

This disclosure is directed to vaporizers for solid materials, particularly vaporizers that have vessels including one or more panels configured to support the solid materials when the vaporizers are in a horizontal orientation.

BACKGROUND

Some manufacturing processes, for example atomic layer deposition (ALD), plasma-enhanced chemical vapor deposition (PECVD), low-pressure chemical vapor deposition (LPCVD), or any other suitable deposition methodologies, or combinations thereof may utilize a stream of a vaporized material. For example, chemical vapor deposition is a process that utilizes a flow of a vaporized material to form a solid layer or film of the material on a surface of a substrate. In another manufacturing process, a stream of a vaporized material is utilized to implant the material into a substrate. This material may be referred to as a reagent. In semiconductor manufacturing, chemical vapor deposition can be used to form one or more precise thin films of solid source material on a substrate. A vaporization vessel can be configured to provide a stream of a vaporized reagent by vaporizing a solid source material with a stream of carrier gas. A solid source material may be in the form of particles, e.g., sintered or non-sintered, granules, or liquids. The vaporization vessel can include a number of trays that are individually filled to distribute the solid materials and conduct heat to the solid material for vaporizing the material. These vessels provide a high degree of consistency in the vapor delivered and high performance in utilization of the contained material but require filling of each individual tray therein and stacking or other assembly of the trays, thereby adding time, cost, and risk of contamination to filling processes.

SUMMARY

This disclosure is directed to vaporizers for solid materials, particularly vaporizers that have vessels including one or more panels configured to support the solid materials when the vaporizers are in a horizontal orientation.

Using the one or more support panels (hereinafter may be referred to as "support panels" or "reagent support panels") to divide the vessel allows vaporizable solid materials to be added to the vessel through a simple filling process in a first orientation where the support panels extend vertically, while allowing those same support panels to support and transfer heat to the materials when in a second orientation where the support panels extend horizontally. In the second orientation the support panels also define sufficient void spaces to facilitate vaporization of the solids resting on each of those support panels.

Such vessels can reduce the difficulty and labor involved in filling standard vaporizer vessels. In standard vaporizer vessels, the individual trays (typically between 6 and 16 trays) each need to be filled separately and installed into the vessel. The trays can have an outer diameter close to that of the inner diameter of the standard vaporizer vessels, requiring great precision to insert without becoming jammed. Further, the precise operations required by standard vaporizer vessels can be made more complex by the cleanliness requirements for vaporizer vessels, thus requiring significant skilled labor (including years or more of training) and/or automation to fill. In contrast, the present vaporizer vessels using support panels instead of individual trays can be bulk filled in a single filling operation, significantly reducing the cost of filling, while still providing acceptable vaporization performance for many applications. Vaporizer vessels using support panels can also be more cost-efficient at larger sizes by removing the high precision required for the individual trays. The use of fixed reagent support panels instead of trays can also streamline the cleaning process for vaporizer vessels prior to filling since separate trays do not need to be cleaned and the features may be simpler in structure. The fixed reagent support panels can further improve structural strength and better resist shocks during transport, further simplifying logistics and reducing the amount of specialized training and care needed during handling of the vessels.

In an embodiment, a vaporizer vessel for vaporizable solid source material includes a vaporizer vessel body including an inner surface defining an interior volume, an inlet configured for introducing carrier gas to the interior volume of the vaporizer vessel for the carrier gas to flow through the interior volume in contact with the vaporizable solid source material so as to form a carrier gas/solid source vapor mixture, and an outlet configured to allow discharge of the carrier gas/solid source vapor mixture from the vaporizer vessel. The vessel further includes at least one thermally conductive reagent support panel located within the interior volume and joined to the vaporizer vessel body at the inner surface with a thermally conducting joint. Each of the at least one thermally conductive reagent support panel extends through the interior volume in a horizontal direction when the vaporizer vessel body is oriented such that the outlet is at an end of the vessel in a longitudinal direction, such that at least a portion of the vaporizable solid source material can rest on the thermally conductive reagent support panel with a void space present between an upper surface of said portion of the vaporizable solid source material and the inner surface of the vaporizer vessel or another of the at least one thermally conductive reagent support panel. Each of the at least one thermally conductive reagent support panel is joined to the vaporizer vessel body by a thermally conductive joint. The at least one thermally conductive reagent support panels may be stainless steel (e.g., 304, 316), nickel, aluminum, graphite, or other suitable material.

In an embodiment, the vaporizer vessel includes a plurality of the thermally conductive reagent support panels. In some embodiments, the vaporizer vessel includes a single thermally conductive reagent support panel. In other embodiments, the vaporizer vessel includes 2, 3, 4, 5, 6, 7, 8, 9, 10, or more thermally conductive reagent support panels. In an embodiment, the vaporizer vessel includes up to 20 thermally conductive reagent support panels. The thermally conductive reagent support panels may extend in a common direction, for example, vertically when the vaporizer vessel is in the filling orientation and horizontal when the vaporizer vessel is in the use orientation. The thermally conductive reagent support panels may be inert to the precursor used with the vaporization vessel, capable of supporting the weight of the precursor, and capable of withstanding the temperature of the vaporization vessel during use at variable of temperatures. In some embodiments, the temperatures can be above 150° C., above 200° C., above 250° C., above 300° C., or above 350° C.

In an embodiment, each of the plurality of the thermally conductive reagent support panels are each parallel to one another. The thermally conductive reagent support panels form a plurality of chambers to contain reagent. The plurality of chambers may be of similar size or of different sizes.

In an embodiment, each of the plurality of the thermally conductive reagent support panel extends from the inner surface of the vaporizer vessel body to a center line of the interior volume. The thermally conductive reagent support panels may form a number of similar chambers to contain reagent. Each chamber may have a substantially uniform horizontal cross section when in the filling orientation, e.g., when the thermally conductive reagent support panels are vertical. In some embodiments, the chambers share a common horizontal cross section. In other embodiments, the chambers have different horizontal cross sections from each other.

In an embodiment, the plurality of thermally conductive reagent support panels is evenly radially distributed around the center line of the interior volume. In an embodiment, the vaporizer vessel includes four thermally conductive reagent support panels. In an embodiment, an angle between any of the thermally conductive reagent support panels and any adjacent thermally conductive reagent support panel is 90°. Other numbers of reagent support panels and different angles are also disclosed. In one embodiment, two thermally conductive reagent support panels may form an angle between 15° and 180°. For example, two thermally conductive reagent support panels may form an angle between 45° and 120°. In another example, the thermally conductive reagent support panels may form an angle between 60° and 90°. The angles formed by the thermally conductive reagent support panels may vary based on the number of thermally conductive reagent support panels, their configuration, the type of reagent to be used with the vaporizer vessel, the size of the vaporizer vessel, etc. In some embodiments, the thermally conductive reagent support panels form identical angles. In other embodiments, the reagent support panels form different angles between them, for example, 90° and 45° or 60° and 120°.

The thermally conductive reagent support panels may have a coating. In an embodiment, the coating is a metal cladding, such as stainless steel on an aluminum core. In an embodiment, the coating enhances the thermal emissivity of the thermally conductive reagent support panel surface to enhance the heat transfer from the surface of the thermally conductive reagent support panel to the reagent on the thermally conductive reagent support panel. In some embodiments, the coating enhances the chemical inertness of the thermally conductive reagent support panel or enhances other properties of the thermally conductive reagent support panel. Example coatings include magnesium fluoride ($MgF_2$), aluminum nitride, molybdenum carbide, silicon oxide, aluminum oxide, yttrium oxide, and anodization.

In an embodiment, the thermally conductive joint extends an entire length of the at least one thermally conductive reagent support panel. This configuration may improve heat transfer from the wall of the vaporizer vessel to the thermally conductive reagent support panel.

In an embodiment, each of the at least one thermally conductive reagent support panel is joined to the inner surface of the vaporizer vessel body by a plurality of the thermally conductive joints. In an embodiment, between the plurality of thermally conductive joints, a gap is present between the thermally conductive reagent support panel and the inner surface of the vaporizer vessel body. The gap may serve to allow circulation of the carrier gas between chambers of the vaporizer vessel.

In an embodiment, the thermally conductive joint is a weld. The thermally conductive joint may be a brazed joint. The thermally conductive joint may be a press fit of the thermally conductive reagent support panels against an interior surface of the vaporizer vessel body. The purpose of the thermally conductive joint is to transfer heat from an inside surface of the vaporizer vessel body into the thermally conductive reagent support panel, the heat then is used to heat the reagent and generate the vapor provided to the outlet for eventual deposition by a vapor deposition system. Heat transfer through the thermally conductive joint may be enhanced by contacting the thermally conductive reagent support panel and the interior surface of the vaporization vessel body. In some embodiments, the thermally conductive joint includes a tab or flange to enhance contact area between the thermally conductive reagent support panel and the interior surface of the vaporization vessel body. In an embodiment, the thermally conductive joint and thermally conductive reagent support panel are three dimensionally printed or cast to form the interior structure of the vaporizer vessel.

In an embodiment, the vaporizer vessel body has an opening that includes a fill port, the fill port spaced apart from the thermally conductive reagent support panels such that the fill port is in communication with all spaces defined by the at least one thermally conductive reagent support panel. The fill port may allow a plurality of chambers defined by the thermally conductive reagent support panels to be filled simultaneously or sequentially. In some embodiments, all the chambers may be filled simultaneously.

In an embodiment, at least one of the plurality of thermally conductive reagent support panels includes one or more openings through said reagent support panel. The openings may provide gas flow (e.g., carrier gas flow, reagent vapor), between different chambers of the vaporizer vessel. The openings may include slits, holes, and/or other shapes.

In an embodiment, a method of filling a vaporizer vessel is provided. The vaporizer vessel includes a vaporizer vessel body. The vaporizer vessel body includes an end including a fill port; and an inner surface defining an interior volume; and at least one thermally conductive reagent support panel located within the interior volume and joined to the vaporizer vessel body at the inner surface, each of the at least one thermally conductive reagent support panel extending through the interior volume. Each of the at least one thermally conductive reagent support panel is joined to the vaporizer vessel body by a thermally conductive joint. The method includes orienting the vaporizer vessel such that each of the at least one thermally conductive reagent support panel extends in a vertical direction and the fill port is provided at a top of the vaporizer vessel and adding at least one vaporizable solid source material to the interior volume of the vaporizer vessel by way of the fill port such that the at least one vaporizable solid source material is present in each space defined by the at least one thermally conductive reagent support panel and the inner surface.

In an embodiment, the at least one vaporizable solid source material includes a tungsten precursor material or a molybdenum precursor material. Other suitable materials include, but are not limited to, dimethyl hydrazine, trimethyl aluminum (TMA), hafnium chloride ($HfCl_4$), zirconium chloride ($ZrCl_4$), indium trichloride, aluminum trichloride, titanium iodide, tungsten carbonyl, $Ba(DPM)_2$, bis di pivaloyl methanato strontium ($Sr(DPM)_2$), $TiO(DPM)_2$, tetra di pivaloyl methanato zirconium ($Zr(DPM)_4$), decaborane, boron, magnesium, gallium, indium, antimony, copper, phosphorous, arsenic, lithium, sodium tetrafluoroborates, precursors incorporating alkyl-amidinate ligands, organometallic precursors, zirconium tertiary butoxide (Zr (t-OBu)$_4$), tetrakisdiethylaminozirconium (Zr(Net$_2$)$_4$), tetrakisdiethylaminohafnium (Hf(Net$_2$)$_4$), tetrakis(dimethylamino) titanium (TDMAT), tertbutyliminotris(deithylamino) tantalum (TBTDET), pentakis(demethylamino)tantalum (PDMAT), pentakis(ethylmethylamino)tantalum (PEMAT), tetrakisdimethylaminozirconium (Zr(NMe$_2$)$_4$), hafniumtertiarybutoxide (Hf(tOBu)$_4$), xenon difluoride (XeF$_2$), xenon tetrafluoride (XeF$_4$), xenon hexafluoride (XeF$_6$), formations of molybdenum including, but not limited to, MoO$_2$Cl$_2$, MoO$_2$, MoOCl$_4$, MoCl$_5$, Mo(CO)$_6$, formations of tungsten including, but not limited to, WCl$_5$ and WCl$_6$, W(CO)$_6$, and compatible combinations and mixtures of two or more of the foregoing.

In an embodiment, the at least one vaporizable solid source material is in a form of a powder when the at least one vaporizable solid source material is added to the interior volume of the vaporizer vessel. The at least one vaporizable solid source material may be poured into the interior volume of the vaporizer vessel when the vaporizer vessel is in a first orientation, the vaporizer vessel may then be turned to a second orientation where the vaporizable solid source material shifts to lie on the thermally conductive reagent support panels. In some embodiments, the interior of the vaporizer vessel includes a plurality of chambers defined by the thermally conductive reagent support panels and/or the interior surface of the vaporizer vessel. The plurality of chambers may be filled simultaneously or sequentially. The vaporizer vessel may then be heated in the second orientation and the thermally conductive reagent support panels may conduct the heat into contact with the vaporizable solid source material.

In an embodiment, a method of vaporizing a vaporizable solid source material includes orienting a vaporizer vessel in which the solid is contained. The vaporizer vessel includes a vaporizer vessel body including an inner surface defining an interior volume, an inlet, an outlet, and at least one thermally conductive reagent support panel located within the interior volume and joined to the vaporizer vessel body at the inner surface. Each of the at least one thermally conductive reagent support panel extends through the interior volume. The vaporizer vessel is oriented such that each of the at least one thermally conductive reagent support panel extends in a horizontal direction, and that at least part of the vaporizable solid source material is resting on one or more of the at least one of thermally conductive reagent support panel. The method includes heating the vaporizer vessel body and transferring heat from the vaporizer vessel body to the at least one thermally conductive reagent support panel by way of thermally conductive joints where the at least one thermally conductive reagent support panel is joined to the inner surface of the vaporizer vessel body. The method further includes transferring heat from each of the at least one thermally conductive reagent support panel to the vaporizable solid source material that is in contact with said thermally conductive reagent support panel to vaporize the vaporizable solid source material.

In an embodiment, the method further includes extracting a vapor including at least some of the vaporizable solid source material from the vaporizer vessel by way of the outlet. The extracted vapor may be used for a vapor deposition process.

In an embodiment, the at least one vaporizable solid source material includes a tungsten precursor material or a molybdenum precursor material. The solid source material may be other precursor materials as discussed above. Alternately, the precursor material may be a liquid at room temperature and/or at use temperature.

In an embodiment, the at least one vaporizable solid source material is in a form of a powder when the vaporizer vessel is oriented in the use orientation. The powder may rest on the support panel and receive heat from the support panel to induce vaporization of the powder.

DRAWINGS

DETAILED DESCRIPTION

This disclosure is directed to vaporizers for solid materials, particularly vaporizers that have vessels including one or more panels configured to support the solid materials when the vaporizers are in a horizontal orientation.

Figure 1:
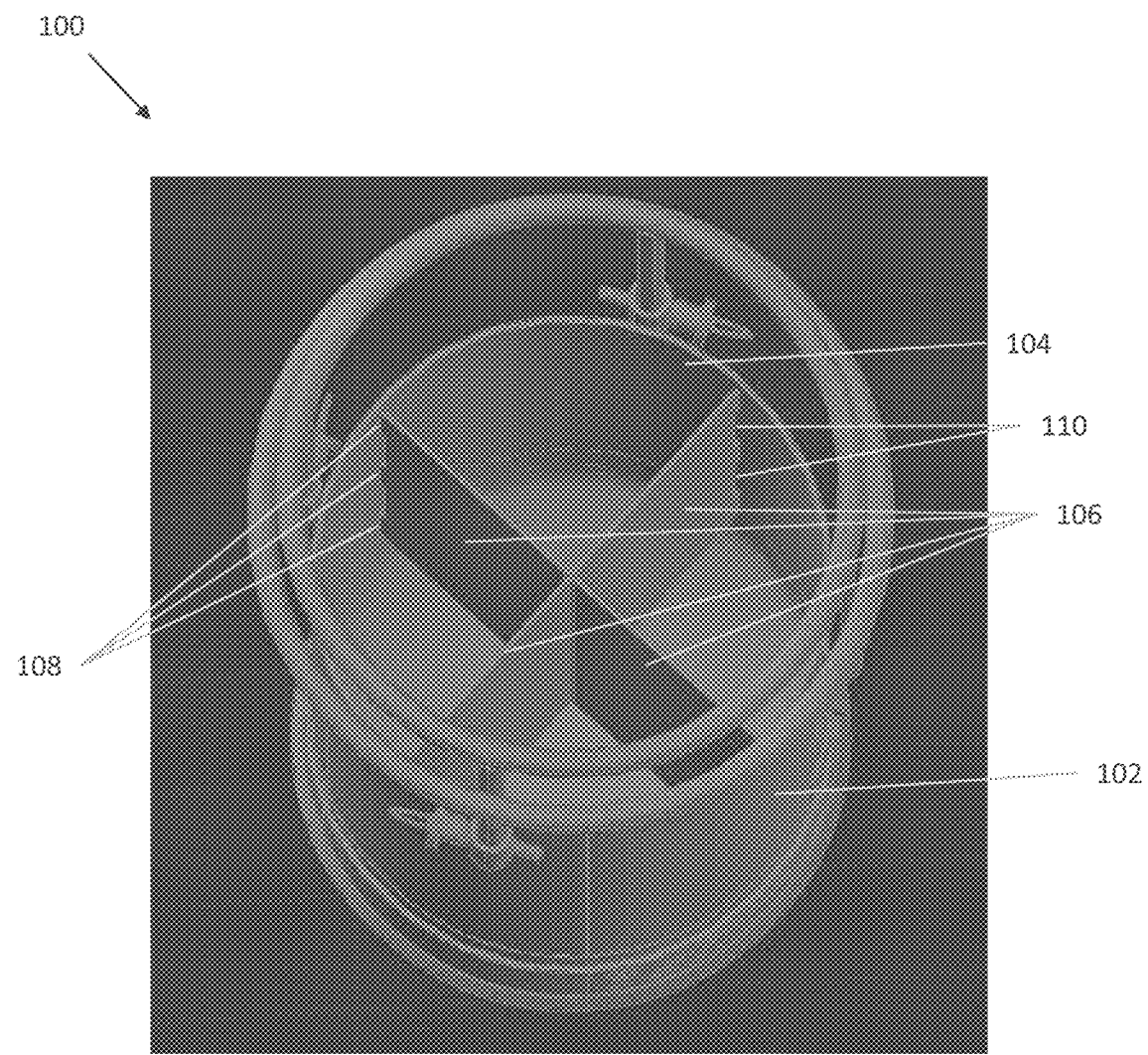
FIG. 1 shows a perspective view of a vaporizer vessel according to an embodiment.

FIG. 1 shows a perspective view of a vaporizer vessel 100 according to an embodiment. Vaporizer vessel 100 includes vessel body 102. Vessel body 102 has an interior surface 104. Reagent support panels 106 are located within the space defined by interior surface 104. Reagent support panels 106 are joined to interior surface 104 by joints 108. Gaps 110 can be included between reagent support panels 106 and interior surface 104. A lid (shown in FIG. 2) can be attached to vessel body 102 to close the interior space defined by interior surface 104.

Vaporizer vessel 100 is a vessel for containing a vaporizable solid material, where the vaporizable solid material can be vaporized to provide a vapor for use in a process, such as a deposition process. The vaporizer vessel 100 can also be referred to as a solids vaporizer, an ampoule, or other such terms. The vaporizer vessel 100 is configured to be heated and to transfer the heat to the vaporizable solid material to produce the vapor. The vaporizer vessel 100 can be configured to be used with a tool such as a vapor deposition tool for a deposition process such as atomic layer deposition (ALD), plasma-enhanced chemical vapor deposition (PECVD), low-pressure chemical vapor deposition (LPCVD), or any other suitable deposition methodologies, or combinations thereof.

Vessel body 102 forms a part of vaporizer vessel 100. Vessel body 102 is thermally conductive such that heating applied to an exterior of the vessel body 102, for example, from a heating jacket or an oven, is transferred to the interior surface 104. Vessel body 102 can include, for example, a metal material such as steel, stainless steel (e.g., 304, 316), nickel, aluminum, etc. Vessel body 102 can have any suitable shape, for example, cylindrical, rectangular, prism shapes, and the like. In an embodiment, vessel body 102 is cylindrical in shape. Vessel body 102 includes interior surface 104. Interior surface 104 is a surface of vessel body 102 defining a space within vessel body 102. The interior surface 104 can, in combination with the reagent support panels 106, define a plurality of chambers within the space within the vessel body 102. The materials and thickness of vessel body 102 can be, but not limited to, selected such that the vaporizer vessel 100 conforms to standards for drop testing and/or pressure testing without use of an additional overpack, for example, Department of Transportation (DOT) standards for such containers. In some embodiments, construction of the vaporizer vessel 100 complies with the latest revision of U.N./DOT CFR 49 parts 171-180 and A.S.M.E. code & addenda. In other embodiments, the materials and thickness of vessel body 102 can be selected based, at least in part, on heat transfer properties, such that the vessel body 102 can conduct heat from a heating jacket or oven to the interior space defined by interior surface 104 and to the reagent support panels 106. In an embodiment, the vessel body 102 may be, but not limited to, from 2 mm to 10 mm in thickness. For example, the vessel body 102 may be approximately 5 mm thick. In embodiments, the vessel body 102 can include stainless steel (e.g., 304, 316), aluminum, graphite, and/or nickel or alloys thereof. The interior surface 104 of the vessel body 102 may include a coating. In an embodiment, the coating enhances heat transfer from the interior surface 104 into chambers formed by the interior surface 104 and reagent support panels 106 in the interior of the vaporization vessel 100. Example coatings include, but are not limited to, metals, ceramics, fluorides, carbides, nitrides, and oxides.

Reagent support panels 106 are panels included within the space defined by interior surface 104. Reagent support panels 106 are configured to support vaporizable solids during use of vaporizer vessel 100 in a vaporization process. Reagent support panels 106 can be planar, shaped, or curved. In an embodiment, reagent support panels 106 are provided in the form of tubes located within the space defined by interior surface 104. Reagent support panels 106 can extend in a direction such that when the vaporizer vessel 100 is in a first orientation, the reagent support panels extend in a vertical direction, and that when the vaporizer vessel 100 is in a second orientation, the reagent support panels 106 extend in a horizontal direction. Reagent support panels 106 can be thermally conductive, for example by including a thermally conductive material such as steel, e.g., 304 or 316 stainless steel, and/or other materials such as nickel, aluminum, graphite, or other suitable materials, such that the reagent support panels 106 can conduct heat from the vessel body 102 to materials in contact with the reagent support panels 106, such as vaporizable solid materials. In an embodiment, reagent support panels 106 do not extend an entire height of the space defined by interior surface 104 of the vessel body 102, for example leaving a gap between the reagent support panels 106 and an end of the vessel body 102 that is open, such as the end where a lid can be attached to vessel body 102, such as the lid 204 shown in FIG. 2 and described below. Reagent support panels 106 can be configured to act as supports that contribute to the structural strength and pressure and drop performance of vessel body 102 as discussed above.

Reagent support panels 106 can be included in any suitable number and configuration such that the reagent support panels can support vaporizable solid materials when vaporizer vessel 100 is in a predetermined orientation where the reagent support panels 106 extend in a horizontal direction. For example, the reagent support panels 106 can form a structure such as a grid or a honeycomb pattern. In the embodiment shown in FIG. 1, the reagent support panels 106 are a plurality of planar sheets, each extending from the inner surface 104 of vessel body 102 towards a center of the vessel body 102, where each of the reagent support panels 106 meets the other reagent support panels 106. In an embodiment, the reagent support panels 106 are evenly radially distributed around the center of the vessel body 102, such that angles formed by each pair of adjacent reagent support panels is the same. In the embodiment shown in FIG. 1, the reagent support panels 106 include four panels, with adjacent panels forming 90 degree angles with one another. In embodiments, coatings can be provided on the reagent support panels 106 to increase the radiation of heat from those reagent support panels. The coating can be any suitable heat-emissive coating, with a non-limiting example being an alumina coating provided by atomic layer deposition (ALD). Other examples of coatings include, but are not limited to, $MgF_2$, aluminum nitride, molybdenum carbide, silicon oxide, yttrium oxide, and anodization. The vaporizable solid materials included in the reagent support panels are selected such that they do not compromise the cleanliness of the interior with respect to the vaporizable solid materials included within vaporizer vessel 100. For example, the vaporizable solid materials can be selected such that they do not react with the vaporizable solids or experience offgassing when the solid contained within is being vaporized.

Reagent support panels 106 and interior surface 104 in combination can divide the space defined by the interior surface 104 to provide a plurality of chambers which can each hold one or more vaporizable solid materials, for example, tungsten precursors, molybdenum precursors, or the like. The chambers can be segments of a grid or honeycomb pattern, spaces within tubes, or any other suitable space defined by reagent support panels 106. Non-limiting examples of the vaporizable solid material can include $AlCl_3$, tungsten halides and their oxyhalides including but not limited to WC's, $WCl_6$ and $WOCl_4$, molybdenum halides and their oxyhalides including but not limited to $MoCl_5$, $MoOCl_4$, and $MoO_2Cl_2$, zirconium chlorides or their oxyhalides including but not limited to $ZrCl_4$ and $ZrOCl_2$, and hafnium chlorides or oxyhalides including $HfCl_4$ but not limited to $HfOCl_2$, and combinations thereof. The vaporizable solid material can be a source material for a vapor used in a manufacturing process, for example vapor deposition processes. The vaporizable solid material can be in a form such that it can shift or flow when an orientation of the vaporizer vessel 100 is changed. In an embodiment, in an orientation where the reagent support panels 106 extend in a vertical direction, the chambers can each be filled with the reagent support panels serving as dividers separating each of the chambers. In an embodiment, filling processes for the vaporizer vessel 100 can distribute the vaporizable solid material among all of the chambers defined by interior surface 104 and the reagent support panels 106. In an embodiment, each of the chambers is filled to less than 100% of the volume within the vaporizer vessel 100, for example between approximately 80% to approximately 90% of capacity, such that void spaces devoid of vaporizable solid material and aside from porosity in the vaporizable solid material can be formed above masses of the vaporizable solid material when the vaporizer vessel 100 is oriented such that the reagent support panels 106 extend in a horizontal direction and the vaporizable solid rests on the reagent support panels 106. The filling of vaporizer vessel 100 can be performed in a single filling step, without needing to fill separate trays and subsequently install each tray into the vessel. The described embodiments may simplify filling operations, reducing costs, reducing filling time, and reducing risk of contamination.

The reagent support panels 106 may be formed from sheet metal. In some embodiments, the reagent support panels 106 are formed of a clad material, e.g., aluminum with stainless steel cladding. Materials for the reagent support panels 106 may be selected based on their cost, formability, thermal conductivity, and/or inertness. The reagent support panels 106 may be formed with a spring configuration such that the reagent support panels 106 press against the interior surface 104 of the vessel body 102. In some embodiments, the reagent support panels 106 are formed from multiple sheets of material.

The chambers may have substantially uniform volumes such that all the chambers are approximately the same volume and hold approximately the same amount of vaporizable solid material. This may encourage more uniform vaporization of the vaporizable solid material across the chambers such that all chambers are exhausted after a similar length of use. In other embodiments, the chambers may have a uniform height between parallel reagent support panels 106. In some embodiments, the chambers of the vaporizer vessel 100 may contain between a hundred grams and several kilograms of vaporizable solid material. In one embodiment, the vaporizer vessel 100 may contain approximately 20 liters of volume and take approximately 30 minutes to fill. Larger or smaller vaporizer vessels 100 are also contemplated. For example, the vaporizer vessel 100 may contain from 10 liters or less to 90 liters or more. Larger vaporizer vessels 100 may accommodate larger amounts of reagent and may have longer times between refilling. In some embodiments, larger vaporizer vessels 100 include more reagent support panels 106. The time to fill the vaporizer vessel 100 may depend on the size of the vaporizer vessel 100, the flow characteristics of the reagent, size of the fill port, etc.

Joints 108 are thermally conductive connections between the interior surface 104 and the reagent support panels 106. Joints 108 can allow heating of vessel body 102 to be transferred to reagent support panels 106, so that the heat in turn can be transferred to vaporizable solid materials on the respective reagent support panels 106 to facilitate vaporization of the materials. Joints 108 can be any suitable thermally conductive connection of the reagent support panels 106 to the interior surface 104, with one non-limiting example being a weld. In an embodiment, gaps 110 may exist between some of joints 108. Gaps 110 may be provided to allow movement of gas within the vessel 100, passage of small particles of the solid source material between chambers, or the like. The gaps 110 may be at points along or between portions of joints 108. In an embodiment, gaps 110 can be provided as openings in one or more of the reagent support panels 106. The gaps 110 may be positioned to allow gas flow between chambers when the vessel 100 is in a use orientation. The joint 108 may include screws or similar hardware to secure the thermally conductive reagent support panel 106 to the vessel body 102. In some embodiments, the joint 108 is a press fit of the reagent support panel 106 against the interior surface 104 of the vessel body 102.

Figure 2:
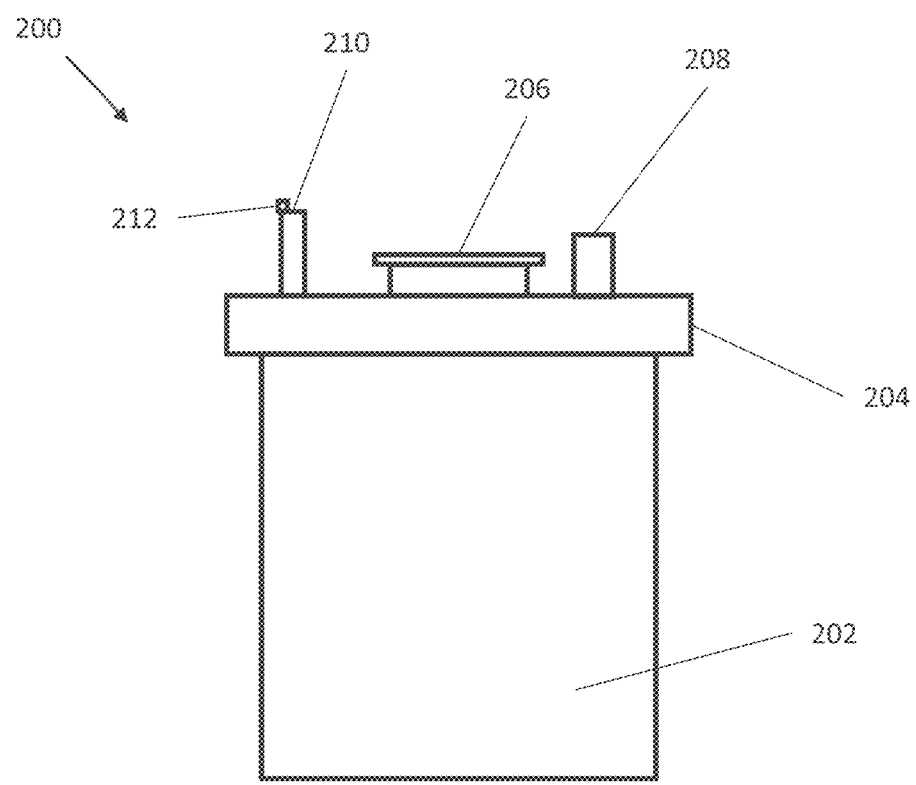
FIG. 2 shows a front view of a vaporizer vessel according to an embodiment.

FIG. 2 shows a front view of a vaporizer vessel 200 according to an embodiment. Vaporizer vessel 200 includes vessel body 202 and lid 204. Vaporizer vessel 200 includes a fill port 206. Vaporizer vessel 200 can further include a carrier gas inlet 208. Vaporizer vessel 200 also includes an outlet 210.

Vessel body 202 defines a vessel including an interior space. Vessel body 202 can include an open end that can be enclosed by lid 204. Vessel body 202 can optionally include one or more features for engaging with lid 204 and/or receiving mechanical fasteners to join lid 204 to the vessel body 202. Vessel body 202 can include reagent support panels 106 in vessel body 202, for example the reagent support panels 106 as described above and shown in FIG. 1. In the orientation of vessel body 202 shown in FIG. 2, the reagent support panels 106 contained within vessel body 202 can extend in a vertical direction, acting as dividers between a plurality of chambers defined within vessel body 202. Vessel body 202 can be thermally conductive such that heating provided to an exterior of the vessel body 202 can be readily transferred to the interior space within vessel body 202 using the reagent support panels. The interior space within vessel body 202 can contain one or more vaporizable solid materials, for example vaporizable solid source materials, for example precursors used in vapor deposition processes or the like.

Lid 204 can be provided at an end of vessel body 202. Lid 204 can be configured to enclose vessel body 202 at the end where lid 204 is attached. Lid 204 can be any suitable shape for enclosing vessel body 202. Lid 204 can include multiple ports allowing materials to be added to and/or removed from the interior space defined by vessel body 202 and lid 204. Lid 204 can be sealed to vessel body 202 such that all flow into and out of the interior space occurs through the one or more openings provided on lid 204 or vessel body 202 such as fill port 206, optional carrier gas inlet 208, and/or outlet 210. Lid 204 can be secured to vessel body 202 by any suitable connection, such as threading, mechanical fasteners such as bolts, engagement features such as flanges or lips, adhesives, or any other suitable connection. In an embodiment, the securement of lid 204 to vessel body 202 can be sealed, for example by inclusion of a gasket, O-ring, or other seal member or the like to seal the interior space defined by vessel body 202 and lid 204.

Fill port 206 is a port allowing introduction of any suitable vaporizable solids, such as vaporizable solid source materials, to the space inside vessel body 202. Fill port 206 can be provided at an end of the vaporizer vessel 200 that is at a top of the vaporizer vessel 200 when the vessel body 202 is oriented such that the reagent support panels extend in a vertical direction. Fill port 206 can be provided on a top end or side of lid 204. Fill port 206 can be sized and/or positioned with respect to the reagent support panels 106 such that each of the chambers receives at least some of the vaporizable solids when they are added through the fill port 206. In an embodiment, fill port 206 is centered over the reagent support panels when they meet at a center of the vessel body 202, and sized such that a portion of the area of fill port 206 is provided over each of the chambers when in plan view when the vessel body 202 is oriented such that the reagent support panels 106 extend in a vertical direction. For example, the vaporizer vessel 200 thus can be filled by orienting the vaporizer vessel 200 such that the fill port 206 is at a top end of the vaporizer vessel 200 and the reagent support panels are extending in a vertical direction and introducing vaporizable solids such as vaporizable solid source material into each chamber within vessel body 202 by way of the fill port 206. Fill port 206 can allow the filling of vaporizer vessel 200 in a single step, without filling and installation of multiple trays. Fill port 206 may allow filling of the vaporizer vessel 200 without removing the lid 204 from the vaporizer vessel 200. In some embodiments, the lid 204 is removed as part of filling the chambers. The lid 204 may be reattached before orienting the vaporizer vessel 200 in the use orientation.

In an embodiment, the vaporizer vessel 200 can include a carrier gas inlet 208. Carrier gas inlet 208 can be provided in any suitable position on the vaporizer vessel 200. In an embodiment, carrier gas inlet 208 is provided at a bottom or on a side of vessel body 202. In an embodiment, carrier gas inlet 208 is provided on the lid 204. In an embodiment, the carrier gas inlet 208 and outlet 210 are provided on the same end of vaporizer vessel 200. Carrier gas inlet 208 is a gas inlet allowing a carrier gas, to be introduced into the interior space within vessel body 202. The carrier gas can be, for example, an inert gas. In an embodiment, the carrier gas can include a reactive gas or a mixture of an inert gas and a reactive gas. The carrier gas can be used to facilitate production and/or extraction of gas including vapor from the vaporizable solid materials contained within vessel body 202. Carrier gas inlet 208 can include a valve to control flow of a carrier gas into the space within vessel body 202. Carrier gas inlet 208 can include fixtures or fittings allowing connection of the carrier gas inlet 208 to a carrier gas source such as a tank of the carrier gas, a carrier gas output included on a deposition tool, or any other suitable source of the carrier gas. The carrier gas inlet 208 provides communication with the interior space within the vessel body 202. In an embodiment, the carrier gas inlet 208 can be connected to one or more tubes configured to deliver the carrier gas to the space within vessel body 202 at one or more predetermined positions. For example, the carrier gas may be delivered to each chamber of the plurality of chambers in the interior space within the vessel body 202.

Outlet 210 is a port configured to allow a fluid, for example, gas containing vapor produced by vaporization of the vaporizable solid materials and optionally carrier gas, to exit the interior space within vessel body 202. Outlet 210 can be configured to connect to a tool such as a deposition tool utilizing the vapor provided at outlet 210. Outlet 210 can include a valve to control the flow of the fluid leaving the interior space within the vessel body 202 by way of outlet 210. Outlet 210 can include fittings or fixtures for connection to a tool that vaporizer vessel 200 is used with. Outlet 210 can be included in any position on vessel body 202 or on lid 204. Outlet 210 can be in any suitable position for communicating fluids such as vapor including the vaporizable solid material to a point outside the vessel body 202. In an embodiment, outlet 210 is provided at a closed end of vessel body 202. In an embodiment, outlet 210 is provided along a side of vessel body 202. In an embodiment, outlet 210 is in a position where the outlet 210 is lower, same, or above the levels of vaporizable solids resting on reagent support panels 106 within the vessel body 202 when the vaporizer vessel 200 is oriented such that the reagent support panels 106 are extending in a horizontal direction. In an embodiment, outlet 210 can include a sensor 212 configured to measure the flow of vapor and/or properties of the vapor such as quantities of the vaporized solids. The sensor 212 can be included in a feedback loop (not shown) to control the production of vapor, for example to improve the consistency of delivery of the vaporized solids from the vaporizer vessel 200. In embodiments, the sensor 212 can be located downstream of outlet 210, for example, along a line connected to outlet 210 or at an inlet of a tool using vapor provided from vaporizer vessel 200. The feedback loop can include controlling flow of carrier gas and/or the heating of vaporizer vessel 200.

Figure 3:
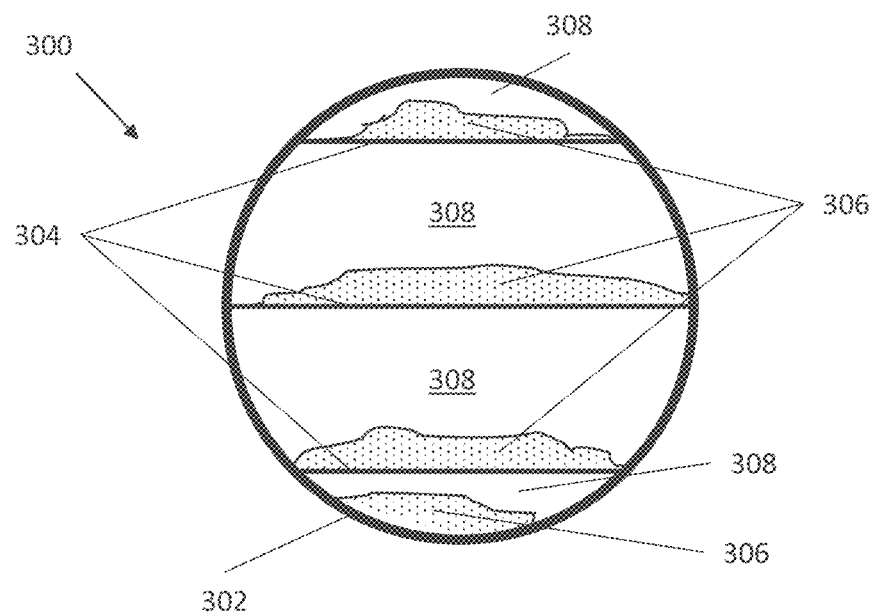
FIG. 3 shows a sectional view of a vaporizer vessel according to an embodiment.

FIG. 3 shows a sectional view of a vaporizer vessel 300 according to an embodiment. Vaporizer vessel 300 includes vessel body 302 and a plurality of reagent support panels 304. Vaporizable solid material 306 rests in each of the chambers defined by the vessel body 302 and reagent support panels 304. The chambers each further include a void space 308 in portions not occupied by the vaporizable solid material 306. The void space 308 may be formed by partially filling the chambers in a filling orientation and then adjusting the orientation to a use orientation such that the vaporizable solid material 306 shifts under gravity to occupy the bottom portions of the chambers.

Vaporizer vessel 300 is a vaporizer vessel for containing vaporizable solid material 306. Vessel body 302 forms a continuous perimeter defining an interior space. In the embodiment shown in FIG. 3, vessel body 302 has as an example, a cylindrical shape providing a circular cross-section seen in FIG. 3. Vessel body 302 can be thermally conductive such that heating provided by a jacket (not shown), or oven (not shown), or the like (not shown) can be conducted to an interior space within the vessel body 302. Vessel body 302 can be made of any suitable material for a vaporizer vessel as discussed above with respect to vessel bodies 102 and 202 discussed above and shown in FIGS. 1 and 2.

Reagent support panels 304 extend through the interior space defined by vessel body 302. In the sectional view of the embodiment shown in FIG. 3, the reagent support panels extend into and out of the page. Reagent support panels 304 can be planar. In the embodiment shown in FIG. 3, the reagent support panels are a plurality of parallel planes. Two or more of reagent support panels 304 can be arranged to be non-parallel to each other. Reagent support panels 304 can be thermally conductive such that they can convey heat to the vaporizable solids 306. Reagent support panels 304 can be joined to the vessel body 302 by thermally conductive joints such as the joints 108 discussed above and shown in FIG. 1, such that when vessel body 302 is heated, for example, using a heating jacket or by placement in an oven, the heat is transferred to reagent support panels 304 and then to vaporizable solid material 306 to facilitate vaporization of the vaporizable solid material 306.

Vessel body 302 and reagent support panels 304 define a plurality of chambers within the interior space defined by the vessel body 302. In the embodiment shown in FIG. 3, the chambers are a series of volumes defined by having the vessel body 302 providing side walls and reagent support panels 304 providing the respective floors and ceilings of each of the chambers.

Vaporizable solid material 306 rests on the vessel body 302 and/or the reagent support panel or panels 304 when the vaporizer vessel is oriented as shown in FIG. 3. The vaporizable solid material 306 can be any suitable solid for vaporization, such as precursor materials including tungsten precursors, molybdenum precursors, and the like. Non-limiting examples of the vaporizable solid material can include $AlCl_3$, tungsten halides and oxyhalides including but not limited to WC's, $WCl_6$ and $WOCl_4$, molybdenum halides and oxyhalides including but not limited to $MoCl_5$, $MoOCl_4$, and $MoO_2Cl_2$, zirconium chlorides or oxyhalides including $ZrCl_4$, and hafnium chlorides or oxyhalides including $HfCl_4$, and combinations thereof. In an embodiment, vaporizable solid material 306 can be in a form allowing the vaporizable solid material 306 to shift or flow in response to changes of orientation of the vaporizer vessel 300. In an embodiment, vaporizable solid material 306 is in the form of a powder. In an embodiment, vaporizable solid material 306 is in a form other than a powder. In an embodiment, vaporizable solid material 306 is in the form of a plurality of pellets or other formed shapes. The vaporizable solid material 306 can be structured, for example, as crystalline and/or aggregate structures. Vaporizable solid material 306 can include suitable vaporizable solid source materials, for example, precursors used in vapor deposition processes or the like. In an embodiment, the vaporizer vessel 300 can be agitated, for example, by shaking or vibration to distribute the vaporizable solid material 306 along the reagent support panels 304 and/or along the inner surface of vessel body 302.

Void space 308 is an open space formed above the vaporizable solid material 306 within each chamber. The void space 308 can accept vaporizable solid material 306 as it vaporizes and facilitates flow of the vapor towards an outlet. In an embodiment, void space 308 can further allow carrier gas to pass over the vaporizable solid material 306. The vaporizer vessel 300 can be filled with vaporizable solid material 306 based on the effects of the extent of filling on the formation of the void space 308. In an embodiment, the vaporizer vessel 300 can be filled with the vaporizable solid material 306 to less than 100% capacity, for example between approximately 80% to approximately 90% capacity, such that there remains open space within the vaporizable vessel such that the void space 308 can be formed when the vaporizer vessel 300 is placed into the horizontal orientation. Vapor and/or carrier gas can pass through the void space 308 to reach an outlet such as outlet 210 described above and shown in FIG. 2 to exit the vaporizer vessel 300, for example to be extracted for use in a process such as deposition of at least one material included in the vapor. In an embodiment, each of the chambers contains or supports a same amount of the vaporizable solid material 306. In an embodiment, each or some of the chambers can contain or support a different amount of the vaporizable solid material 306. In an embodiment, the amount of void space 308 in each of the chambers is the same. In an embodiment, the amount of void space 308 in each or some of the chambers can differ.

Figure 4:
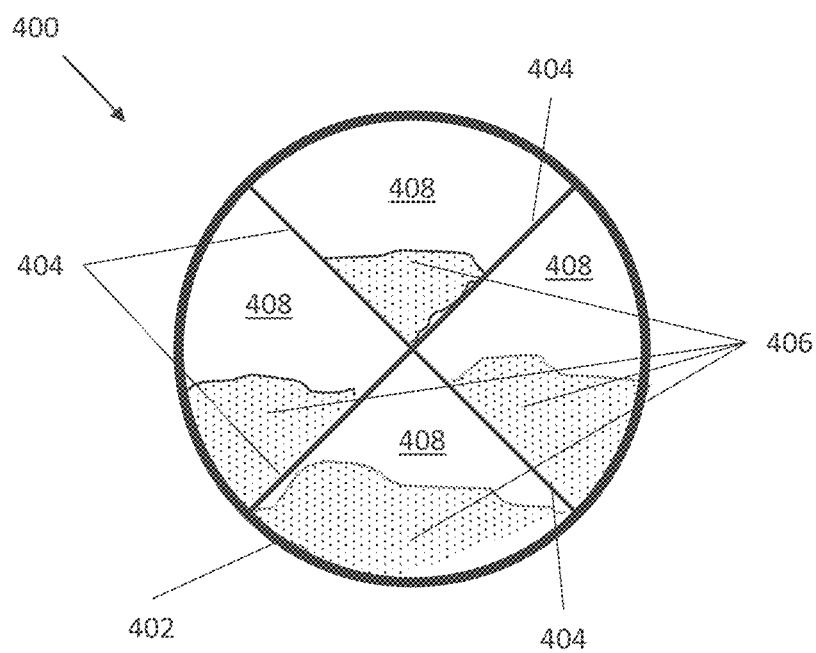
FIG. 4 shows another sectional view of a vaporizer vessel according to an embodiment.
Figure 5A:
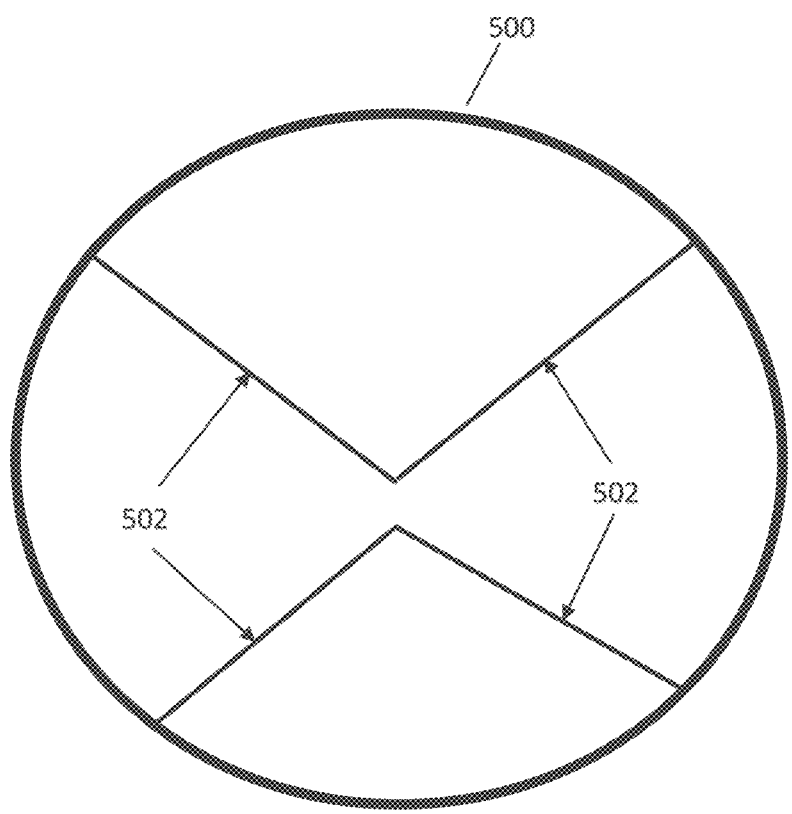
FIGS. 5A-5D show several sectional views of vaporizer vessels according to various embodiments.
Figure 5B:
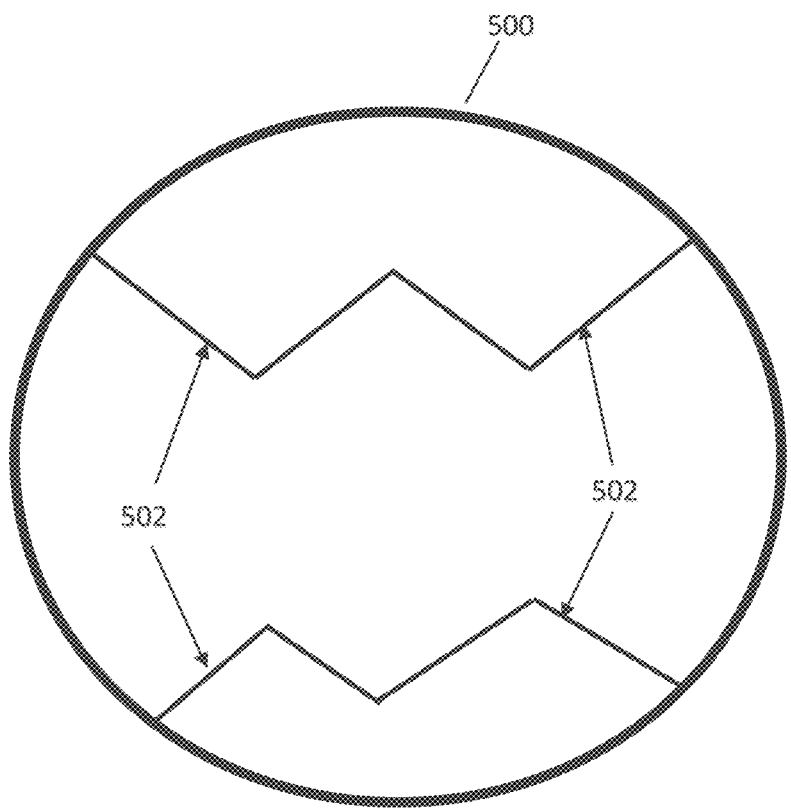
Figure 5C:
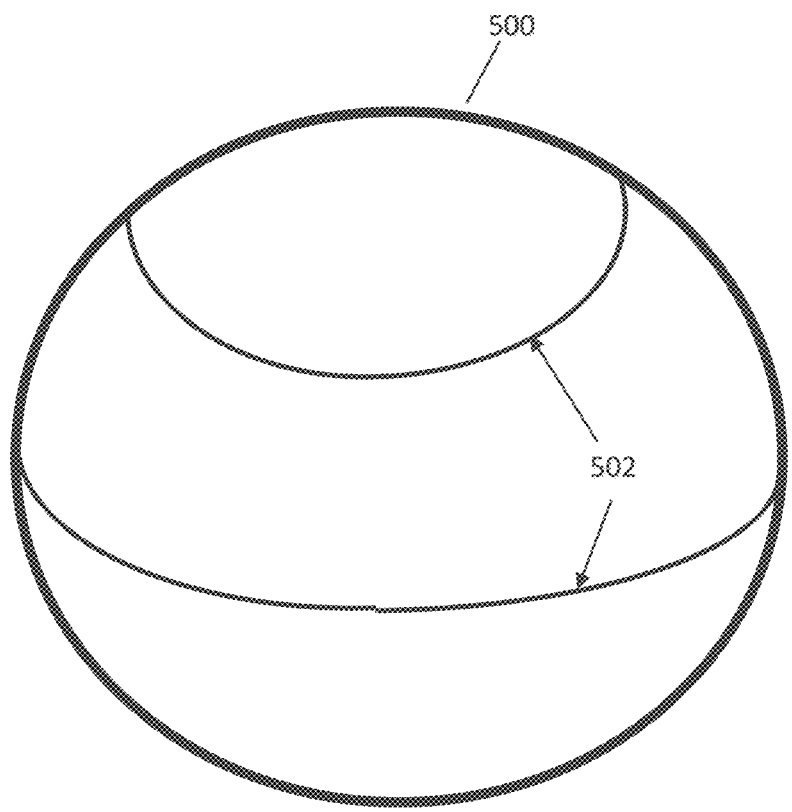
Figure 5D:
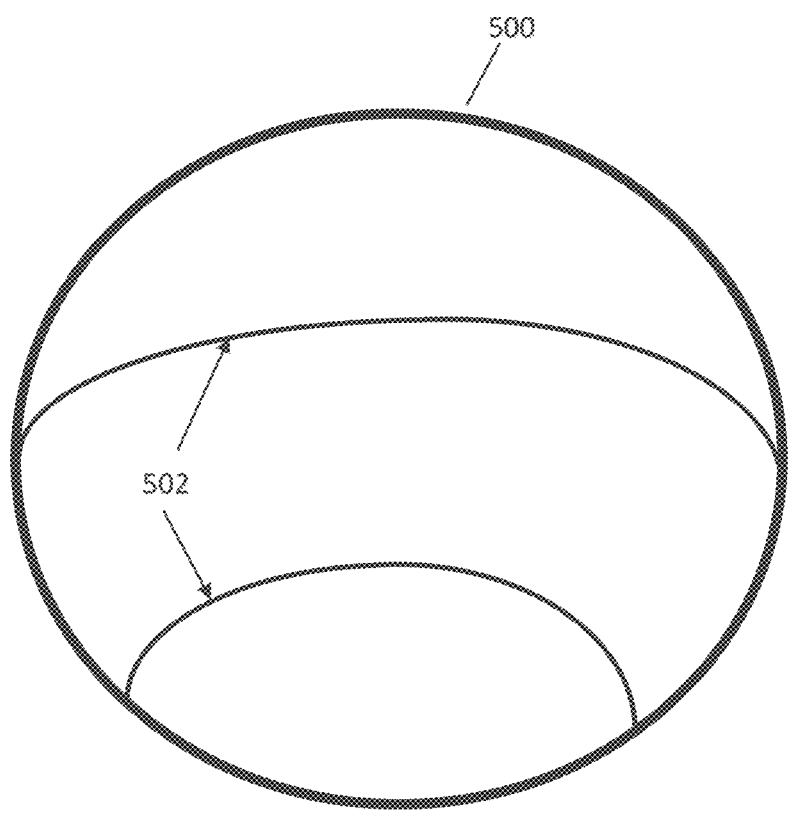

FIG. 4 shows a sectional view of a vaporizer vessel according to an embodiment. Vaporizer vessel 400 includes vessel body 402 and a plurality of reagent support panels 404. Vaporizable solid material 406 can rest in any or all of the one or more of the chambers defined by the vessel body 402 and reagent support panels 404. The chamber including the vaporizable solid material 406 further includes void space 408 in a portion of the chamber that is not occupied by the vaporizable solid material 406.

Vaporizer vessel 400 is a vaporizer vessel for containing vaporizable solid material 406. Vessel body 402 forms a continuous perimeter defining an interior space. In the embodiment shown in FIG. 4, vessel body 402 has for example, a cylindrical shape providing a circular cross-section seen in FIG. 4. Vessel body 402 can be thermally conductive such that heating provided by a jacket (not shown), or oven (not shown), or the like (not shown) can be conducted to an interior space within the vessel body 402. Vessel body 402 can be any suitable material for a vaporizer vessel as discussed above with respect to vessel bodies 102 and 202 discussed above and shown in FIGS. 1 and 2.

Reagent support panels 404 extend through the interior space defined by vessel body 402. In the sectional view of the embodiment shown in FIG. 4, the reagent support panels extend into and out of the page. Reagent support panels 404 can be planar. In the embodiment shown in FIG. 4, the reagent support panels 404 are a plurality of planar sheets, each extending from the inner surface of vessel body 402 towards a center of the vessel body 402, where each of the reagent support panels 404 meets the other reagent support panels 404. In an embodiment, the reagent support panels 404 are evenly radially distributed around the center of the vessel body 402, such that angles formed by each pair of adjacent reagent support panels 404 are the same. In the embodiment shown in FIG. 4, the reagent support panels 404 include four panels, with adjacent panels forming 90 degree angles with one another, similar to the embodiment shown in FIG. 1 and described above. However, the angle formed with a pair of adjacent reagent support panels 404 can be different in the vessel body 402. Reagent support panels 404 can be thermally conductive such that they can convey heat to the vaporizable solid material 406. Reagent support panels 404 can be joined to the vessel body 402 by thermally conductive joints such as the joints 108 discussed above and shown in FIG. 1, such that when vessel body 402 is heated, for example using a heating jacket, or by placement in an oven, or the like, the heat is transferred to reagent support panels 404 and then to vaporizable solid material 406 to facilitate vaporization of the vaporizable solid material 406.

Vessel body 402 and reagent support panels 404 define a plurality of chambers within the interior space defined by the vessel body 402. In the embodiment shown in FIG. 4, the chambers are a series of volumes defined by two of the reagent support panels 404 and a portion of the inner surface of vessel body 402 providing the perimeter of the chamber. Other embodiments may use a different number of reagent support panels 404 to define a chamber. In some embodiments, the chamber may be defined by reagent support panels 404 and not by a portion of the inner surface of the vessel body 402. For example, the chambers may be circular, rectangular, or hexagonal.

Vaporizable solid material 406 rests on the vessel body 402 and/or the reagent support panel or panels 404 when the vaporizer vessel 400 is oriented as shown in FIG. 4. The vaporizable solid material 406 can be any vaporizable solid source materials, for example precursors used in vapor deposition processes or the like. Non-limiting examples of the vaporizable solid include tungsten precursors, molybdenum precursors, and the like. Non-limiting examples of the vaporizable solid material can include $AlCl_3$, tungsten halides and oxyhalides including but not limited to WC's, $WCl_6$ and $WOCl_4$, molybdenum halides and oxyhalides including but not limited to $MoCl_5$, $MoOCl_4$, and $MoO_2Cl_2$, zirconium chlorides or oxyhalides including $ZrCl_4$, and hafnium chlorides or oxyhalides including $HfCl_4$, and combinations thereof. In an embodiment, vaporizable solid material 406 can be in a form allowing the vaporizable solid material 406 to shift or flow in response to changes of orientation of the vaporizer vessel 400. For example, the vaporizable solid material 406 may shift in position in the respective chamber when the vaporizer vessel 400 is changed from a filling orientation to a use orientation. In an embodiment, vaporizable solid material 406 is in the form of a powder. In an embodiment, vaporizable solid material 406 is in a form other than a powder. In an embodiment, vaporizable solid material 406 is in the form of pellets or other formed shapes. The vaporizable solid material 406 can be structured, for example, as crystalline and/or aggregate structures. Vaporizable solid material 406 can include suitable vaporizable solid source materials, for example, precursors used in vapor deposition processes or the like. In an embodiment, the vaporizer vessel 400 can be agitated, for example by shaking or vibration to distribute the vaporizable solid material 406 along the reagent support panels 404 and/or along inner surfaces of vessel body 402.

Void space 408 is open space formed above the vaporizable solid material 406 within each chamber. The void space 408 can accept vaporizable solid material 406 as it vaporizes and allow flow of the vapor towards an outlet. In an embodiment, void space 408 can further allow carrier gas to pass over the vaporizable solid material 406. The vaporizer vessel 400 can be filled with vaporizable solid material 406 based on the effects of the extent of filling on the formation of the void space 408. In an embodiment, the vaporizer vessel 400 can be filled with the vaporizable solid 406 to being less than 100% of the volume within vaporizer vessel 400, for example between approximately 80% to approximately 90% of the volume within vaporizer vessel 400, such that there remains open space within the vaporizable vessel such that the void space 408 can be formed when the vaporizer vessel 400 is placed into the horizontal orientation. Vapor and/or carrier gas can pass through the void space 408 to reach an outlet, such as outlet 210 described above and shown in FIG. 2 to exit the vaporizer vessel 400, for example to be extracted for use in a process such as deposition of at least one material included in the vapor.

The filling process for the described vaporizer vessel 400 may include orienting the vaporizer vessel 400 in a first orientation with the thermally conductive reagent support panel 404 oriented vertically to allow filling of the chambers. The chambers may be filled until 80% to 90% full using a fill port. The vaporizer vessel 400 may be oriented in a use orientation with the thermally conductive reagent support panel 404 extending in a horizontal direction. The vaporizable solid material 406 shifts in response to the change in orientation to rest on the thermally conductive reagent support panel 404.

FIGS. 5A-5D show several sectional views of vaporizer vessels 500 according to various embodiments. The vaporizer vessels 500 include a number of thermally conductive reagent support panels 502 which support reagent during processing. The thermally conductive reagent support panels 502 may be straight or curved. The thermally conductive reagent support panels 502 may be zig-zag. A variety of different configurations for the thermally conductive reagent support panel 502 are shown. The design of the thermally conductive reagent support panels 502 may consider thermal conductivity, volume of the formed chambers, reagent properties or form (e.g., pellets, particles), and other design considerations. The design of the thermally conductive reagent support panels 502 may be selected to produce vaporization of the reagent with various levels of reagent in the vaporizer vessel 500. For example, as the amount of reagent in the vaporizer vessel 500 is reduced, the amount of surface area of the thermally conductive reagent support panels 502 in contact with the reagent may decrease. In other embodiments, the contact area of reagent with the thermally conductive reagent support panels 502 may stay reasonably constant as the reagent level decreases.

Aspects:

It is understood that any of aspects 1-14 can be combined with any of aspects 15-17 or 18-21 to the extent feasible. It is understood that any of aspects 15-17 can be combined with any of aspects 18-21 to the extent feasible.

Aspect 1. A vaporizer vessel for vaporizable solid source material, comprising:
a vaporizer vessel body including an inner surface defining an interior volume;
an inlet configured for introducing carrier gas to the interior volume of the vaporizer vessel for flow of the carrier gas through the interior volume in contact with the vaporizable solid source material to form a carrier gas/solid source vapor mixture; and
an outlet configured to allow discharge of the carrier gas/solid source vapor mixture from the vaporizer vessel; and
at least one thermally conductive reagent support panel located within the interior volume and joined to the vaporizer vessel body at the inner surface by a thermally conductive joint, each of the at least one thermally conductive reagent support panel extending in a first, vertical direction when the vaporizer vessel body is oriented in a filling orientation and the at least one thermally conductive reagent support panel extending horizontally to support a portion of the vaporizable solid source material when in a second, use orientation.

Aspect 2. The vaporizer vessel according to aspect 1, wherein the vaporizer vessel includes a plurality of the thermally conductive reagent support panels.

Aspect 3. The vaporizer vessel according to aspect 2, wherein each of the plurality of the thermally conductive reagent support panels are each parallel to one another.

Aspect 4. The vaporizer vessel according to any of aspects 2-3, wherein each of the plurality of the thermally conductive reagent support panel extends from the inner surface of the vaporizer vessel body to a center line of the interior volume.

Aspect 5. The vaporizer vessel according to aspect 4, wherein the plurality of thermally conductive reagent support panels is evenly radially distributed around the center line of the interior volume.

Aspect 6. The vaporizer vessel according to any of aspects 1-5, wherein the vaporizer vessel comprises four thermally conductive reagent support panels.

Aspect 7. The vaporizer vessel according to aspect 6, wherein an angle between any of the thermally conductive reagent support panels and any adjacent thermally conductive reagent support panel is 90°.

Aspect 8. The vaporizer vessel according to any of aspects 1-7, wherein the thermally conductive joint extends an entire length of the at least one thermally conductive reagent support panel.

Aspect 9. The vaporizer vessel according to any of aspects 1-8, wherein each of the at least one thermally conductive reagent support panel is joined to the inner surface of the vaporizer vessel body by a plurality of the thermally conductive joints.

Aspect 10. The vaporizer vessel according to aspect 9, wherein between the plurality of thermally conductive joints, a gap is present between the thermally conductive reagent support panel and the inner surface of the vaporizer vessel body.

Aspect 11. The vaporizer vessel according to any of aspects 1-10, wherein the thermally conductive joint is a weld.

Aspect 12. The vaporizer vessel according to any of aspects 1-11, wherein the vaporizer vessel further comprises an opening that includes a fill port, the fill port spaced apart from the thermally conductive reagent support panels such that the fill port is in communication with all spaces defined by the at least one thermally conductive reagent support panel.

Aspect 13. The vaporizer vessel according to any of aspects 1-12, wherein at the least one thermally conductive reagent support panel includes one or more openings through said reagent support panel.

Aspect 14. The vaporizer vessel according to any of aspects 1-13, wherein a material of the at least one thermally conductive reagent support panel is selected from a group consisting of stainless steel, nickel, aluminum, and graphite.

Aspect 15. A method of filling a vaporizer vessel for vaporizable solid source material,
the vaporizer vessel including a vaporizer vessel body, the vaporizer vessel body comprising: an end including a fill port; and an inner surface defining an interior volume; and at least one thermally conductive reagent support panel located within the interior volume and joined to the vaporizer vessel body at the inner surface, each of the at least one thermally conductive reagent support panel extending through the interior volume, wherein each of the at least one thermally conductive reagent support panel is joined to the vaporizer vessel body by a thermally conductive joint, the method comprising:

orienting the vaporizer vessel such that each of the at least one thermally conductive reagent support panel extends in a vertical direction and the fill port is provided at a top of the vaporizer vessel; and adding at least one vaporizable solid source material to the interior volume of the vaporizer vessel by way of the fill port such that the at least one vaporizable solid source material is present in each space defined by the at least one thermally conductive reagent support panel and the inner surface.

Aspect 16. The method according to aspect 15, wherein the at least one vaporizable solid source material includes a tungsten precursor material or a molybdenum precursor material.

Aspect 17. The method according to any of aspects 15-16, wherein the at least one vaporizable solid source material is in a form of a powder when the at least one vaporizable solid source material is added to the interior volume of the vaporizer vessel.

Aspect 18. A method of vaporizing a vaporizable solid source material, comprising:

orienting a vaporizer vessel in which the vaporizable solid source material is contained, the vaporizer vessel comprising:

a vaporizer vessel body including an inner surface defining an interior volume;

an inlet;

an outlet; and at least one thermally conductive reagent support panel located within the interior volume and joined to the vaporizer vessel body at the inner surface, each of the at least one thermally conductive reagent support panel extending through the interior volume;

wherein the vaporizer vessel is oriented such that each of the at least one thermally conductive reagent support panel extends in a horizontal direction, and that at least part of the vaporizable solid source material is resting on one or more of the at least one of thermally conductive reagent support panel;

heating the vaporizer vessel body, transferring heat from the vaporizer vessel body to the at least one thermally conductive reagent support panel by way of thermally conductive joints where the at least one thermally conductive reagent support panel is joined to the inner surface of the vaporizer vessel body, transferring heat from each of the at least one thermally conductive reagent support panel to the vaporizable solid source material that is in contact with said thermally conductive reagent support panel so as to vaporize the vaporizable solid source material.

Aspect 19. The method according to aspect 18, further comprising extracting a vapor including at least some of the vaporizable solid source material from the vaporizer vessel by way of the outlet.

Aspect 20. The method according to any of aspects 18-19, wherein the at least one vaporizable solid source material includes a tungsten precursor material or a molybdenum precursor material.

Aspect 21. The method according to any of aspects 18-20, wherein the at least one vaporizable solid source material is in a form of a powder when orienting the vaporizer vessel.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

The invention claimed is:

1. A vaporizer vessel for vaporizable solid source material, comprising:

a vaporizer vessel body including an inner surface defining an interior volume;

an inlet configured for introducing carrier gas to the interior volume of the vaporizer vessel for flow of the carrier gas through the interior volume in contact with the vaporizable solid source material to form a carrier gas/solid source vapor mixture; and an outlet configured to allow discharge of the carrier gas; solid source vapor mixture from the vaporizer vessel; and at least one thermally conductive reagent support panel located within the interior volume and joined to the vaporizer vessel body at the inner surface by a thermally conductive joint, each of the at least one thermally conductive reagent support panel extending in a first, vertical direction when the vaporizer vessel body is oriented in a filling orientation and the at least one thermally conductive reagent support panel extending horizontally to support a portion of the vaporizable solid source material when in a second, use orientation, wherein each of the at least one thermally conductive reagent support panel is joined to the inner surface of the vaporizer vessel body by a plurality of the thermally conductive joints, wherein between the plurality of thermally conductive joints, a gap is present between the thermally conductive reagent support panel and the inner surface of the vaporizer vessel body, and wherein the at least one thermally conductive reagent support panel is formed of sheet metal.

2. The vaporizer vessel of claim 1, wherein the vaporizer vessel includes a plurality of the thermally conductive reagent support panels.

3. The vaporizer vessel of claim 2, wherein each of the plurality of the thermally conductive reagent support panels are each parallel to one another.

4. The vaporizer vessel of claim 2, wherein each of the plurality of the thermally conductive reagent support panel extends from the inner surface of the vaporizer vessel body to a center line of the interior volume.

5. The vaporizer vessel of claim 4, wherein the plurality of thermally conductive reagent support panels is evenly radially distributed around the center line of the interior volume.

6. The vaporizer vessel of claim 1, wherein the vaporizer vessel comprises four thermally conductive reagent support panels.

7. The vaporizer vessel of claim 1, wherein an angle between any of the thermally conductive reagent support panels and any adjacent thermally conductive reagent support panel is 90°.

8. The vaporizer vessel of claim 1, wherein the thermally conductive joint extends an entire length of the at least one thermally conductive reagent support panel.

9. The vaporizer vessel of claim 1, wherein the thermally conductive joint is a weld.

10. The vaporizer vessel of claim 1, further comprising a fill port, the fill port spaced apart from the thermally conductive reagent support panels such that the fill port is in communication with all spaces defined by the at least one thermally conductive reagent support panel.

11. The vaporizer vessel of claim 1, wherein the at least one thermally conductive reagent support panel includes one or more openings through said reagent support panel.

12. The vaporizer vessel of claim 1, wherein a material of the at least one thermally conductive reagent support panel is selected from a group consisting of stainless steel, nickel, aluminum, and graphite.

* * * * *